United States Patent [19]

Takiba et al.

[11] Patent Number: 5,208,488
[45] Date of Patent: May 4, 1993

[54] POTENTIAL DETECTING CIRCUIT

[75] Inventors: Akira Takiba; Osamu Matsumoto; Yukihiro Saeki, all of Yokohama, Japan

[73] Assignee: Kabushiki Kaisha Toshiba, Kawasaki, Japan

[21] Appl. No.: 937,452

[22] Filed: Aug. 31, 1992

Related U.S. Application Data

[63] Continuation of Ser. No. 486,348, Feb. 28, 1990, abandoned.

[30] Foreign Application Priority Data

Mar. 3, 1989 [JP] Japan .................................. 1-51711

[51] Int. Cl.$^5$ .................. H03K 5/153; H03K 19/0175
[52] U.S. Cl. .............................. 307/362; 307/296.4; 307/296.5; 307/350; 307/451; 307/475
[58] Field of Search ............... 307/351, 362, 475, 443, 307/451, 296.5, 350, 296.4, 296.8; 365/185, 189.09, 189.11

[56] References Cited

U.S. PATENT DOCUMENTS

| 4,195,238 | 3/1980 | Sato | 307/475 |
| 4,264,828 | 4/1981 | Perlegos et al. | 307/475 |
| 4,365,316 | 12/1982 | Iwahashi et al. | 307/475 |
| 4,404,480 | 7/1983 | Ransom et al. | 307/475 |
| 4,405,870 | 9/1983 | Eden | 307/475 |
| 4,486,671 | 12/1984 | Ong | 307/475 |
| 4,490,633 | 12/1984 | Nouter et al. | 307/475 |
| 4,504,743 | 3/1985 | Aoyama et al. | 307/571 |
| 4,587,447 | 5/1986 | Baehring | 307/475 |
| 4,626,704 | 12/1986 | Takata et al. | 307/350 |
| 4,638,241 | 1/1987 | Colles | 323/312 |
| 4,642,488 | 2/1987 | Parker | 307/475 |
| 4,658,156 | 4/1987 | Hashimoto | 307/296.5 |
| 4,709,165 | 11/1987 | Higuchi et al. | 307/350 |
| 4,709,172 | 11/1987 | Williams | 307/350 |
| 4,809,010 | 12/1989 | Neudeck et al. | 307/475 |
| 4,812,680 | 3/1989 | Kawashima et al. | 307/362 |
| 4,922,133 | 5/1990 | Iwashi et al. | 307/362 |
| 5,013,935 | 5/1991 | Mahabadi | 307/350 |
| 5,065,361 | 11/1991 | Yoshizawa et al. | 365/104 |

Primary Examiner—William L. Sikes
Assistant Examiner—Terry D. Cunningham
Attorney, Agent, or Firm—Finnegan, Henderson, Farabow, Garrett & Dunner

[57] ABSTRACT

A potential detecting circuit comprises a first MOS transistor of a first conductivity type whose drain receives an input potential that is equal to or lower, in absolute value, than a second potential whose absolute value is higher than that of a first potential, a second MOS transistor of a second conductivity type whose source is connected to the source of the first transistor and gate receives the first potential, a third MOS transistor of the first conductivity type whose source is connected to the second MOS transistor, source receives a reference potential whose absolute value is lower than that of the first potential, and gate receives the first potential, a detecting potential control block for applying to the first MOS transistor a potential varying in accordance with the input potential, and a potential detect output terminal for providing a detected potential, the potential detect output terminal being a junction between the drains of the second and third MOS transistors.

35 Claims, 4 Drawing Sheets

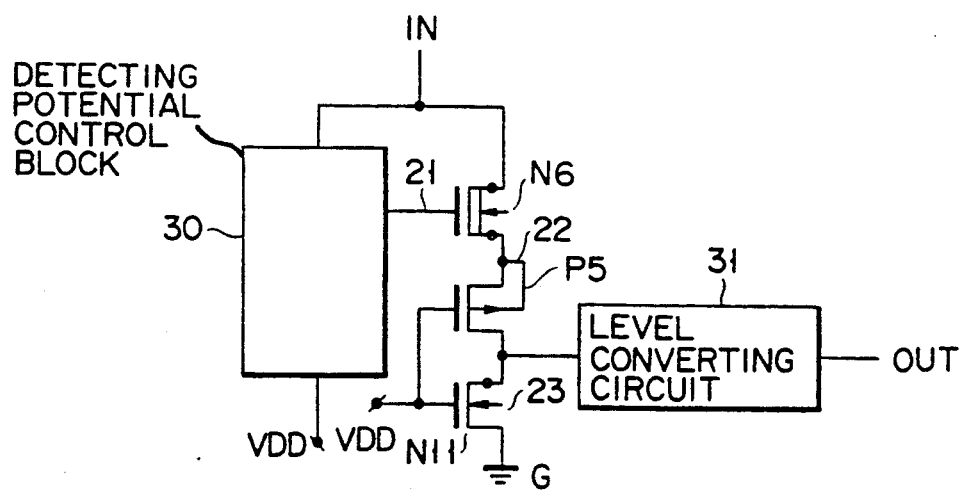
F I G. 2

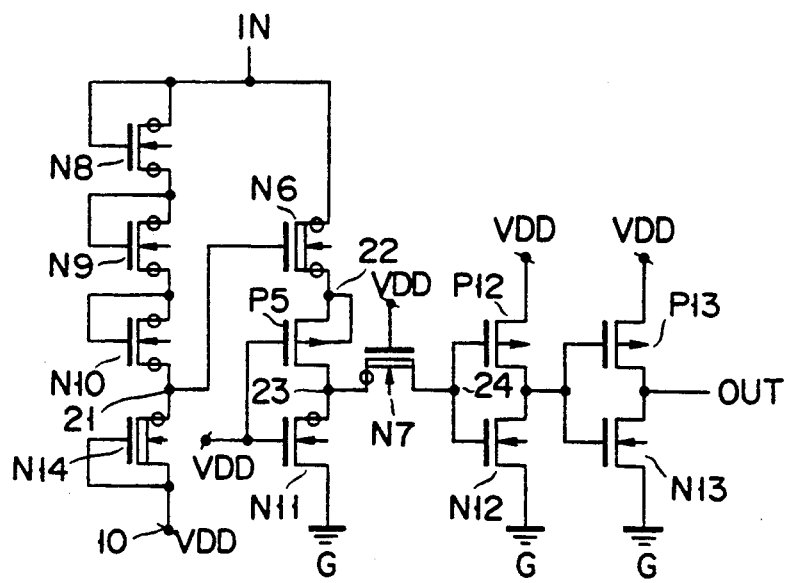
F I G. 3
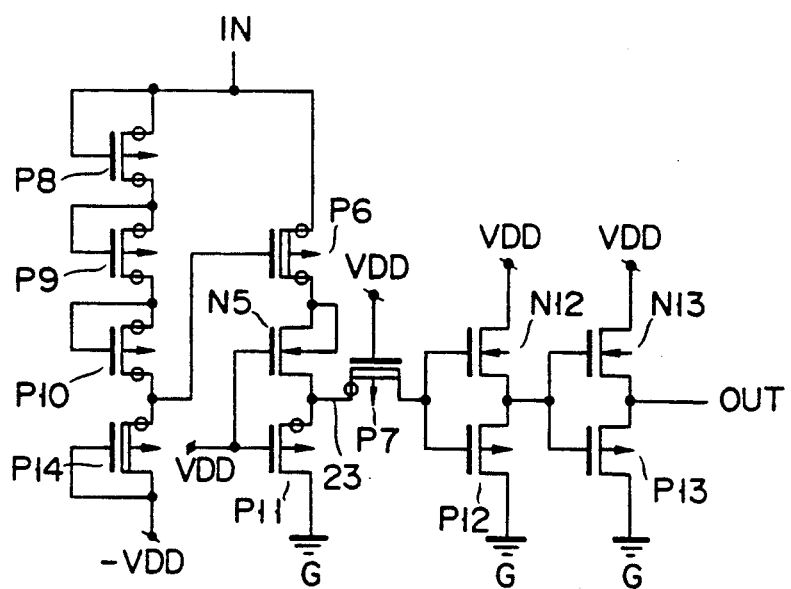
F I G. 5

POTENTIAL DETECTING CIRCUIT

This application is a continuation division of application Ser. No. 07/486,348 filed Feb. 28, 1990 now abandoned.

BACKGROUND OF THE INVENTION

1. Field of the Invention

The present invention relates to a potential detecting circuit, and more particularly to a potential detecting circuit for detecting a potential which is similar to the power source potential of a CMOS LSI, and a potential which is much higher than the reference potential or the power source potential of the CMOS LSI.

2. Description of the Related Art

In an LSI with a nonvolatile memory, for example an EPROM, it is required that a write mode be changed to a read mode, and vice versa. To operate the LSI in the write mode, an externally applied voltage $V_{pp}$, which is much higher than the LSI power source $V_{DD}$ potential, is required.

FIG. 1 shows a prior art potential detecting circuit. In this circuit, an input terminal IN for receiving an input potential VIN is grounded through PMOS transistors P1 and P2 and an NMOS transistor N1. A potential detection signal is derived from an output terminal OUT1, through an inverter consisting of two pairs of MOS transistors P3 and N3, and P4 and N4.

The high breakdown voltage transistor is different from the transistor of the $V_{DD}$ system in the following respects:

1) The high breakdown voltage transistor has an LDD (lightly doped drain) structure.
2) The high breakdown voltage transistor has a thick gate oxide film.

In FIG. 1, the MOS transistors of the LDD structure are indicated by small circles attached to the drains.

Let us consider two different operations of the prior art potential detecting circuit shown in FIG. 1, when the input potential of the circuit is equal to an LSI power source, high potential $V_{pp}$, e.g., 20 V, which is much higher than an LSI power source, low potential $V_{DD}$, e.g., 5 V, and when the input potential is equal to the power source potential $V_{DD}$.

a) When the high potential $V_{pp}$ (20 V) is applied to the input terminal IN, a potential at node 5 is lower than the potential $V_{pp}$ by the amount of the threshold voltage $V_{THp1}$ of the PMOS transistor P1. If the potential at node 5 is higher than a sum of the threshold voltage $V_{THp2}$ of the PMOS transistor P2 and the gate potential $V_{DD}$, the PMOS transistor P2 is turned on. Under this condition, a current flows from the input terminal IN to the ground point G through the PMOS transistors P1 and P2 and the NMOS transistor N1. The potential at node 6 progressively rises by a ratio of the sum of the ON-resistance of the PMOS transistors P1 and P2 to the ON resistance of the NMOS transistor N1.

i) When the potential at node 6 is higher than the threshold voltage of the inverter including the MOS transistors P3 and N3, a potential at the $V_{DD}$ level is output from the output terminal OUT1. ii) When the former is lower than the latter. A ground level potential is output from the output terminal OUT1.

b) When a potential $V_{DD}$ equal to or lower than the potential $V_{pp}$ is applied to the input terminal IN, the potential at node 5 is lower than a sum of the threshold voltage $V_{THZ}$ of the PMOS transistor P2 and the gate potential $V_{DD}$. Therefore, the transistor P2 remains off while the transistor N1 remains on. Accordingly, a ground level potential is output from the output terminal OUT1.

In this way, the potential detecting circuit can detect the input potential $V_{IN}$, the high potential $V_{pp}$, or the low potential $V_{DD}$. The potential detecting circuit is characterized in that, even when a potential between the ground level and the $V_{DD}$ level is applied to the input terminal, the PMOS transistor P2 is turned off, and hence no DC path is formed. It is also characterized in that the drains of the transistors P3 and N3 are of the LDD structure type and can withstand a high potential applied to the gates of those transistors.

To assemble the circuit, including the high breakdown voltage PMOS transistor P2 and the like as shown in FIG. 1, into an LSI chip which does not use high breakdown voltage PMOS transistors, another type of transistors must be used. This means that the number of manufacturing process steps must increase. In this regard, it should be noted that to manufacture an LSI containing elements such as $E^2$PROM, polysilicon electrodes for the $V_{DD}$ system and those for the high breakdown voltage cells are separately formed. In this case, the following additional three steps are performed in the photo etching process:

a) To implant ions into the channels of high breakdown voltage PMOS transistors,
b) To form the LDD structure of high breakdown voltage NMOS transistors by using a mask, and
c) To form the LDD structure of high breakdown voltage PMOS transistors by using a mask.

It is evident that the increased number of process steps leads to an increase in the manufacturing cost and manufacturing time.

SUMMARY OF THE INVENTION

Accordingly, an object of the present invention is to provide a potential detecting circuit capable of detecting a high potential (whose absolute value is great, in comparison with the negative potential) in an LSI of the type in which high breakdown voltage PMOS (or NMOS) transistors having a high breakdown structure such as the LDD structure, are not used.

To achieve the above object, there is provided a potential detecting circuit in a semiconductor device supplied with a reference potential, a first potential higher, in absolute value, than the reference potential, and a third potential higher, in absolute value, than the first potential, wherein a first MOS transistor of a first conductivity type, a second MOS transistor of a second conductivity type, and a third MOS transistor of the first conductivity type are connected in series, a node between of the second and third MOS transistors serves as a potential detect output, a potential lower than the second potential is applied to the drain of the first MOS transistor, the reference potential is applied to the source of the third MOS transistor, and the first potential is applied to the gates of the second and third transistors, and a detect potential controller applies to the gate of the first MOS transistor a potential varying in accordance with the input potential. Such a structure as to withstand the application of a high potential is not employed for the second MOS transistor.

Thus, in an LSI with different power sources, the potential detecting circuit can detecting a potential higher, in absolute value, than the potential $V_{DD}$, and can comprise the high breakdown voltage MOS transistors of the first conductivity type and the transistors of the second conductivity type used in the $V_{DD}$ (normal MOS LSI power source) system, rather than the high breakdown voltage MOS transistors of the second conductivity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram showing a potential detecting circuit according to an embodiment of the present invention;

FIG. 3 is a circuit diagram showing the details of the potential detecting circuit of FIG. 2;

FIG. 5 is a circuit diagram showing a potential detecting circuit according to another embodiment of the present invention.

DETAILED DESCRIPTION OF THE PREFERRED EMBODIMENTS

Figure 1:
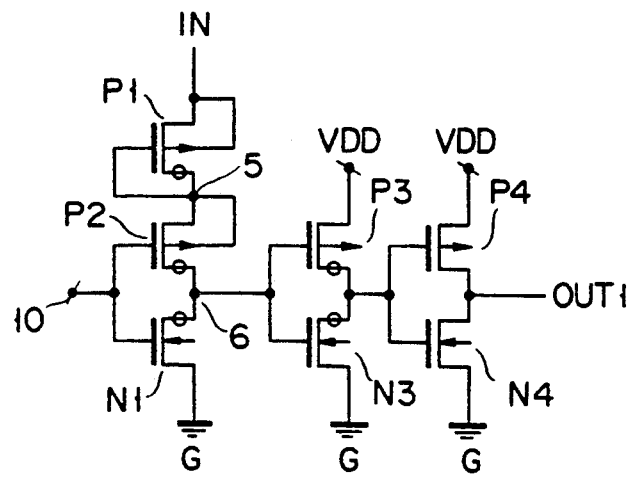
FIG. 1 is a circuit diagram showing a conventional potential detecting circuit.

Some specific embodiments of the present invention will be described with reference to the accompanying drawings.

FIG. 2, illustrates a high potential detecting circuit according to an embodiment of the present invention. In FIG. 2, like components as those shown in FIG. 1 (prior art) are designated by the same symbols for simplicity. In FIG. 2, reference numeral 30 denotes a detecting potential control block. When the potential $V_{pp}$, which is much higher than the LSI power source potential $V_{DD}$, is applied to an input terminal IN, the detecting potential control bock 30 produces at its output terminal 21 a potential higher than the potential $V_{DD}$. When a potential lower than the potential $V_{DD}$ or higher, but not much higher, than the potential $V_{DD}$ is applied to the input terminal, the block 30 produces the potential $V_{DD}$ at its output terminal 21. Reference numeral 31 indicates a level converting circuit. A level converting circuit 31 changes the potential appearing at an input terminal 23 to a potential of "$V_{DD}$—ground potential". The input terminal IN is connected to the drain of a D-type (depletion-type) NMOS transistor N6. The transistors, which are NMOS and PMOS transistors, are of the E-type (enhancement-type). The source of the D-type NMOS transistor N6 is connected to the source and the back gate of a PMOS transistor P5. The gate of the transistor N6 is connected to the output terminal 21 of the detecting potential control circuit 30.

The gates of the PMOS transistor P5 and the NMOS transistor N11 are connected to the potential $V_{DD}$. The source of the transistor N11 is grounded. The potential applied to the input terminal IN passes through the level converting circuit 31, and is outputted in the form of a detected potential, from the output terminal OUT.

The potential detecting circuit of FIG. 2 is illustrated in detail in FIG. 3. The detecting potential control block 30 shown in FIG. 2 is arranged as follows. The input terminal IN is connected to the drain and the gate of an NMOS transistor N8. The source of the transistor N8 is connected to the drain and the gate of an NMOS transistor N9. The source of the transistor N9 is connected to the drain and the gate of the NMOS transistor N10. The source of the transistor N10 is connected to the drain of the D-type NMOS transistor N14. The source and the gate of the transistor N14 is connected to the potential $V_{DD}$.

The level converting circuit 31 shown in FIG. 2 has the structure described as follows. The input terminal 23 is connected to the drain of a D-type transistor N7. The gate of the transistor N7 is connected to the potential $V_{DD}$, and the source of the transistor N7 is connected to the input terminal of an inverter has a PMOS transistor P12 and an NMOS transistor N12. As output terminal of the inventor is connected to an output terminal out of an inverter having PMOS transistor P13 and NMOS transistor N13.

In the circuit of FIG. 3, as is understood from mark o, the LDD structure is employed for the sources and the drains of the NMOS transistors N8, N9, and N10, and the D-type NMOS transistor N6, and the drains of the NMOS transistor N11 and the D-type NMOS transistors N14, and N7. It is noted here that the PMOS transistor P5 is a normal $V_{DD}$ system transistor and, unlike the PMOS transistor P2 in FIG. 1, does not employ the LDD structure for the drain.

Operations of two modes of the potential detecting circuit thus arranged and shown in FIG. 3 will be described.

a) A first operation mode of the potential detecting circuit starts when a potential lower than the potential $V_{DD}$ is applied to the input terminal IN.

In this mode, the source and the gate of the NMOS transistor N14 are both at the $V_{DD}$ level. Accordingly, the potential $V_{DD}$ in applied at the node 21 between the drain of the transistor N14 and the source of the NMOS transistor 10. At this time, the potential lower than the potential $V_{DD}$ has been applied to the input terminal IN. Accordingly, no current flows through the current paths of the NMOS transistors N8 to N10, because those transistors are reversely biased. Since the potential at the node 21 is applied to the gate of the D-type NMOS transistors N6, the transistor N6 is turned on, and the potential lower than $V_{DD}$ at the input terminal IN is applied the source of the PMOS transistor P5 via the transistor N6. At this time, the potential $V_{DD}$ has been applied to the gate of the PMOS transistor P5, and hence the transistor P5 is turned off. The potential $V_{DD}$ has also been applied to the gate of the transistor P11, which has been turned on. Accordingly, the node is pulled down to the ground potential. This potential goes through the D-type NMOS transistor N7, which has been in an on state because the potential $V_{DD}$ is applied to the gate thereof, and the two-stage inverter, and applied at the output terminal Out. Accordingly, when the potential below the $V_{DD}$ level is applied to the input terminal IN, the output terminal Out provides the potential of the ground level.

b) A second operation mode of the potential detecting circuit starts when the potential $V_{pp}$ (which is much higher than the potential $V_{DD}$.

When the potential $V_{pp}$ is applied to the input terminal IN, a potential at the node 2 is determined by the back-gate effect of the NMOS transistors N8 to N10, and the ON-resistance of the D-type NMOS transistor N14. Since the potential at the node 21 is applied to the gate of the transistor N6, a potential at a node 22 is expressed as "(potential at node 21)+ |(threshold voltage $V_{TH}$ of transistor N6 influenced by the back-gate effect)|". Thus, the detecting potential control block 30 is a circuit for determining a potential at the node 22 and controlling the potential so as not to degrade the PMOS transistor P5. Since the potential at the source and gate of the PMOS transistor P5 is higher than "$V_{DD}+$ |threshold voltage $V_{TH}$ of the PMOS transistor P5|" when the potential at the node 22 rises, the transistor P5 is turned on, and a potential at the input terminal 23 is determined by a ratio of the ON-resistance of the transistor P5 and that of the NMOS transistor N11 which has been already turned on. The potential at node 24 connected to the source of D-type NMOS transistor N7, which is turned on by applying potential $V_{DD}$ to the gate thereof, is substantially equal to a potential at input terminal 23. The potential at the node 24 is controlled to be below "$V_{DD}+$ |threshold voltage $V_{TH}$ of transistor N7 influenced by the back gate effect|", thereby protecting the PMOS transistor P12 and NMOS transistor N12 from its gate breakdown, e.g., breakage of the gate insulating film. This fact implies that there is no need for introducing the high breakdown voltage structure to the PMO transistor P12 and NMOS N12, although the potential detecting circuit of FIG. 1 uses such a measure, or the LDD structure.

The potential at the node 24 increases higher than the threshold voltage of the inverter consisting of the PMOS transistor P12 and the NMOS transistor N12, and goes through the two-stage inverter consisting of the paired transistors P12 and N12, and P13 and N13, and appears as the potential of the $V_{DD}$ level at the output terminal Out. The potential of $V_{DD}$ level is output from the output terminal Out. It is thus detected that a high potential $V_{pp}$ is applied to the input terminal In.

The circuit shown in FIG. 3 has the following feature. When the potential level is between the ground potential and the potential $V_{DD}$, no current flows through the current path consisting of the NMOS transistors N8 to N10, as already stated.

As seen from the foregoing description, the potential detecting circuit according to the embodiment shown in FIG. 3 is constructed by using E- and D-type NMOS transistors and the PMOS transistors (particularly, the transistor P5) of the $V_{DD}$ system, not the high breakdown voltage PMOS transistor like the PMO transistor P2 in the prior art of FIG. 1. The potential detecting circuit thus constructed is capable of detecting a high potential. Accordingly, when the potential detecting circuit is assembled into the LS not using the high breakdown voltage MOS transistors with the LDD structure, the manufacturing time is reduced, the production yield is improved, and the cost to manufacture is reduced. Further, when the input potential is between the ground potential and the potential $V_{DD}$, no current path is formed between the high and low power sources. The input impedance of the circuit is extremely high. Therefore, the input terminal IN may be used for another terminal, for example, data input terminal.

Figure 4:
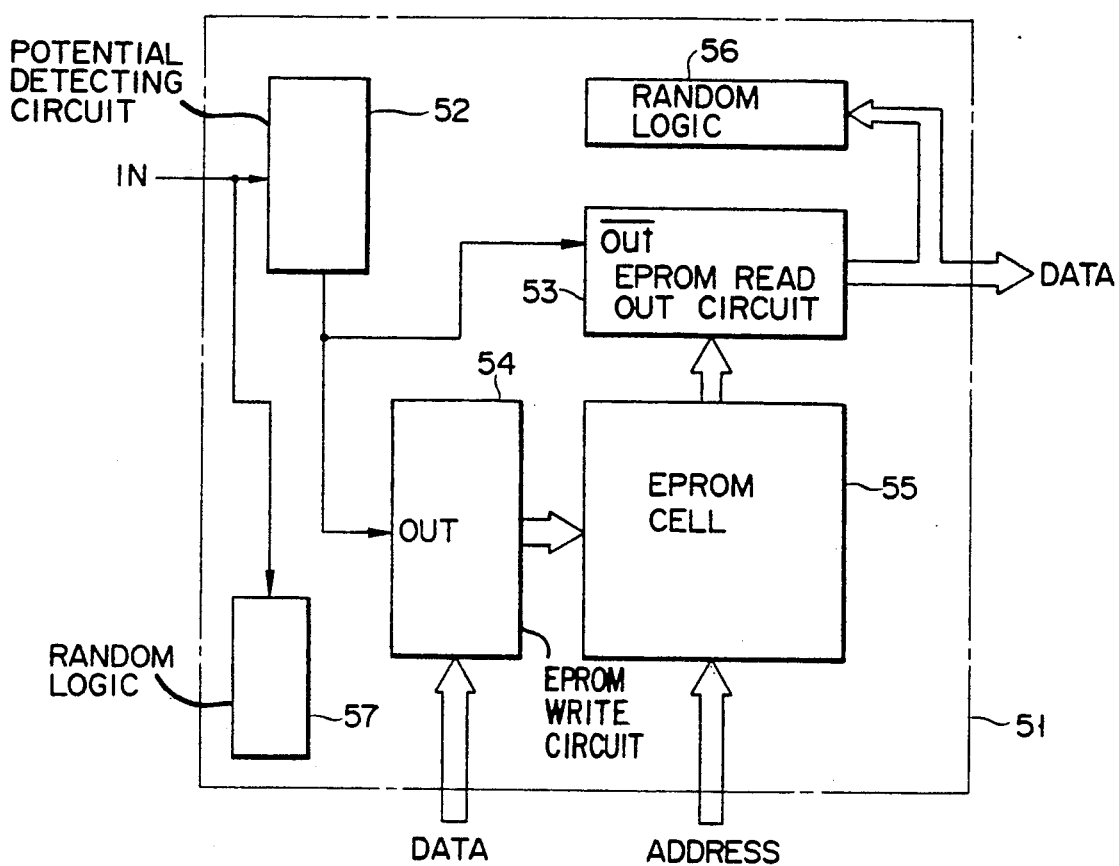
FIG. 4 is a block diagram of an EPROM-contained LSI into which a potential detecting circuit according to the present invention is assembled.

An LSI having an EPROM into which a potential detecting circuit according to the present invention is incorporated, will be described with reference to FIG. 4. In the figure, reference numeral 51 designates an LSI chip; 52, a potential detecting circuit according to the present invention; 53, an EPROM read out circuit; 54, an EPROM write circuit; 55, an EPROM cell array; 56, 57, random logics. The potential $V_{DD}$ at the output terminal Out of the potential detecting circuit 52 drives the write circuit 54, while the ground potential at the output terminal Out drives the read out circuit 53.

The write circuit 54 is for writing data into the EPROM cell array 55. The read out circuit 53 reads data from the cell array 55. To separately operate the read and write circuits, it is necessary to change a read mode to a write mode and vice versa. To this end, a select signal $V_{pp}$ is used, and the potential detecting circuit 52 which operates in response to the select signal is provided In this case, such an operation of the potential detecting circuit suffices that it produces the $V_{DD}$ potential for the potential of the $V_{pp}$ level, and produces ground potential for the input potential of the $V_{DD}$ level or less. Alternatively, the reversed case is also allowed. In the FIG. 4 circuit, the EPROM write circuit 54 goes into an active state when the output from the potential detecting circuit 52 is at level $V_{DD}$. The read out circuit 53 goes into an active state when the output from the potential detecting circuit 52 is at the ground potential level. With such an arrangement, the write mode and the read mode may be selectively set up by applying the potential $V_{pp}$ or $V_{DD}$ to one of the input terminals IN of the LSI, which connects to the potential detecting circuit 52 contained therein. Thus, the input potential applied to the potential detecting circuit 52 is applied from the outside of the LSI chip, and the output potential of the circuit 52 is used for selecting the read mode or the write mode within the LSI. In this instance, when the input terminal is at a potential of the $V_{DD}$ level or less, it serves as an input terminal to the random logic 57.

It should be understood that the present invention is not limited to the specific embodiments as mentioned above, but may be variously changed and modified within the scope of the present invention. While the embodiment as described with reference to FIGS. 2 and 3 is the high potential detecting circuit, the present invention may also be embodied into a low potential detecting circuit as shown in FIG. 5. Here, the term "low potential" means a potential much lower than potential—$V_{DD}$. An arrangement of the low potential detecting circuit o FIG. 5 is featured in that the PMOS transistors are replaced by the NMOS transistors, and the potential $V_{DD}$ is replaced by the potential—$V_{DD}$. The arrangement of the FIG. 5 may readily be understood on the analogy of the arrangement of the high potential detecting circuit of FIGS. 2 and 3. The reference symbols denoting the transistors in FIG. 4 are replaced characters, P by N, or vice versa followed by the same numerals as those in FIGS. 2 and 3. The operation of the low potential detecting circuit of FIG. 5 will be understood with the reversed polarity. The detect voltage controller 30 is operable with only two transistors (specifically, the transistors P8 and P9 are omissible, if required).

Figure 6:
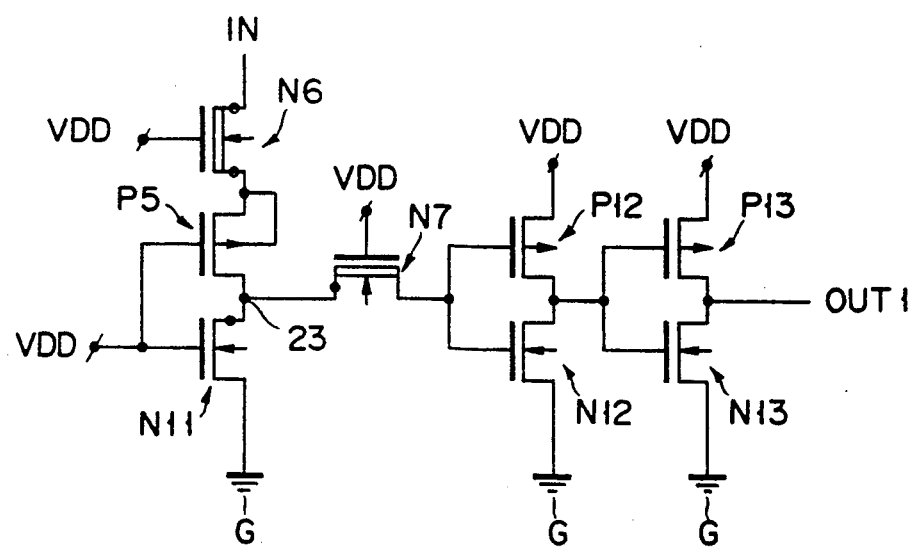
FIG. 6 is a circuit diagram showing a potential detecting circuit according to another embodiment of the present invention.

The detecting potential control block 30, which is designed to control a desired detecting potential, can be of any circuit which can control such a potential. Further, the block 30 can be dispensed with, as is shown in FIG. 6, depending upon the value of the detecting potential. Moreover, the gate input of the DMOS transistor N6 can be a fixed potential, for example, $V_{DD}$ (the first potential).

Additional advantages and modifications will readily occur to those skilled in the art. Therefore, the invention in its broader aspects is not limited to the specific details, representative devices, shown and described herein. Accordingly, various modifications may be made without departing from the spirit or scope of the general inventive concept as defined by the appended claims and their equivalents.

What is claimed is:

1. A potential detecting circuit comprising:
    a first terminal for receiving an input potential, the input potential having an absolute value equal to or lower than a first potential;
    a second terminal for receiving a second potential;
    a third terminal for receiving a reference voltage having an absolute value less than an absolute value of the second potential;
    a fourth terminal for receiving another potential;
    a first MOS transistor of a first conductivity type having a gate coupled to the fourth terminal, and a drain coupled to the first terminal, and a source, the first MOS transistor being characterized by a certain breakdown voltage;
    a second MOS transistor of a second conductivity type having a source coupled to the source of the first MOS transistor, a gate coupled to the second terminal, and a drain, the second MOS transistor being characterized by a breakdown voltage substantially lower than the certain breakdown voltage; and
    a third MOS transistor of the first conductivity type having a drain coupled to the drain of the second MOS transistor, a source coupled to the third terminal, and a gate coupled to the second terminal, wherein the first potential has an absolute valve greater than an absolute value of the second potential.

2. The potential detecting circuit according to claim 1, wherein said second potential is a positive potential, said first potential is another positive potential higher than said second potential, said first conductivity type is an N type, and said second conductivity type is a P type.

3. The potential detecting circuit according to claim 1, wherein said second potential is a negative potential, said first potential is another negative potential higher than said second potential, said first conductivity type is a P type, and said second conductivity type is an N type.

4. The potential detecting circuit according to claim 3, wherein a back-gate of said second MOS transistor is connected to the source of said first MOS transistor.

5. The potential detecting circuit according to claim 3, wherein said first MOS transistor is of the depletion type.

6. The potential detecting circuit according to claim 3, further including a level change circuit, responsive to a voltage at the drain of the second MOS transistor, for generating a converted potential having a value of said reference potential or of said second potential.

7. The potential detecting circuit according to claim 1, wherein a back-gate of said second MOS transistor is connected to the source of said first MOS transistor.

8. The potential detecting circuit according to claim 1, wherein said first MOS transistor is of the depletion type.

9. The potential detecting circuit according to claim 1, further including a level converting circuit, responsive to a voltage at the drain of the second MOS transistor, for generating a converted potential having a value of said reference potential or of said second potential.

10. The potential detecting circuit according to claim 1, wherein the first and second potentials are both positive, the first conductivity type is a P type, and the second conductivity type is an N type.

11. The potential detecting circuit according to claim 1, wherein the first MOS transistor is of the depletion type.

12. A potential detecting circuit comprising:
    a first terminal for receiving an input potential, the input potential having an absolute value equal to or lower than a first potential;
    a second terminal for receiving a second potential;
    a third terminal for receiving a reference voltage having an absolute value less than an absolute value of the second potential;
    a fourth terminal for receiving another potential;
    a first MOS transistor of a first conductivity type having a gate coupled to the fourth terminal, a drain coupled to the first terminal, a drain coupled to the first terminal, and a source, the first MOS transistor being characterized by a certain breakdown voltage;
    a second MOS transistor of a second conductivity type having a source coupled to the source of the first MOS transistor, a gate coupled to the second terminal, and a drain, the second MOS transistor being characterized by a breakdown voltage substantially lower than the certain breakdown voltage;
    a third MOS transistor of the first conductivity type having a drain coupled to the drain of the second MOS transistor, a source coupled to the third terminal means, and a gate coupled to the second terminal; and
    a detect voltage controller for producing said another potential depending on the input potential and applying said another potential to the fourth terminal, wherein the first potential has an absolute value greater than an absolute value of the second potential.

13. The potential detecting circuit according to claim 12, wherein said second potential is a positive potential, said first potential is another positive potential higher than said second potential, said first conductivity type is an N type, and said second conductivity type is a P type.

14. The potential detecting circuit according to claim 12, wherein said second potential is a negative potential, said first potential is another negative potential higher than said second potential, said first conductivity type is a P type, and said second conductivity type is an N type.

15. The potential detecting circuit according to claim 14, wherein a back-gate of said second MOS transistor is connected to the source of said first MOS transistor.

16. The potential detecting circuit according to claim 14, wherein said first MOS transistor is of the depletion type.

17. The potential detecting circuit according to claim 14, wherein said second MOS transistor does not contain a high breakdown voltage structure.

18. The potential detecting circuit according to claim 14, wherein when an absolute value of said input potential is higher than said second potential by a first amount, said detecting voltage controller produces an output potential determined by said input potential, and when the absolute value of said input potential is within a range whose upper limit is higher than the second potential by an amount less than the first amount and whose lower limit is lower than the second potential, said detect voltage controller produces said second potential.

19. The potential detecting circuit according to claim 18, wherein the first amount is approximately 15 volts.

20. The potential detecting circuit according to claim 14, wherein said detecting potential control block includes at least fourth and fifth MOS transistors of the first conductivity connected in series, a source and gate of said fifth MOS transistors being coupled to said second potential, a node between said fourth and fifth MOS transistors being coupled to the gate of said first MOS transistor, a gate and drain of said fourth MOS transistor being interconnected, and the gate and drain of said fourth MOS transistor being coupled to said input terminal.

21. The potential detecting circuit according to claim 14, further including a level converting circuit, responsive to a voltage at the drain of the second MOS transistor, for generating a converted potential having a value of said reference potential or of said second potential.

22. The potential detecting circuit according to claim 21, wherein the level converting circuit includes
a fourth MOS transistor of the first conductivity type, having a drain coupled to the drain of the second MOS transistor, a gate coupled to the second potential, and a source;
an inverter having an input coupled to the source of the fourth transistor.

23. The potential detecting circuit according to claim 12, wherein a back-gate of said second MOS transistor is connected to the source of said first MOS transistor.

24. The potential detecting circuit according to claim 12, wherein said first MOS transistor is of the depletion type.

25. The potential detecting circuit according to claim 12, wherein said second MOS transistor has a structure other than a high breakdown voltage structure.

26. The potential detecting circuit according to claim 12, wherein when an absolute value of said input potential is higher than said second potential by a first amount, said detect voltage controller produces an output potential determined by said input potential, and when the absolute value of said input potential is within a range whose upper limit is higher than the second potential by an amount less than the first amount and whose lower limit is lower than the second potential, said detect voltage controller produces said second potential.

27. The potential detecting circuit according to claim 26, wherein the first amount is approximately 15 volts.

28. The potential detecting circuit according to claim 12, wherein said detect voltage controller includes fourth and fifth MOS transistors of the first conductivity type connected in series, a source and gate of said fifth MOS transistor coupled to said second terminal, a node between said fourth and fifth MOS transistors coupled to the gate of said first MOS transistor, a gate and drain of said fourth MOS transistor being interconnected, and the gate and drain of said fourth MOS transistor being coupled to said input terminal.

29. The potential detecting circuit according to claim 12, further including a level converting circuit, responsive to a voltage at the drain of the second MOS transistor, for generating a converted potential having a value of said reference potential or of said second potential.

30. The potential detecting circuit according to claim 29, wherein the level converting circuit includes
a fourth MOS transistor of the first conductivity type, having a drain coupled to the drain of the second MOS transistor, a gate coupled to the second potential, and a source;
an inverter having an input coupled to the source of the fourth transistor.

31. A potential detecting circuit comprising:
a first terminal for receiving an input potential, the input potential having an absolute value equal to or lower than a first positive potential;
a second terminal for receiving a second potential;
a third terminal for receiving a reference voltage having an absolute value less than an absolute value of the second potential;
means for generating a potential depending on the input potential;
first MOS transistor of a P type having a gate coupled to said means for generating a potential depending on the input potential, a drain coupled to the first terminal, and a source, the first MOS transistor being characterized by a certain breakdown voltage;
a second MOS transistor of an N type having a source coupled to the source of the first MOS transistor, a gate coupled to the second terminal, and a drain, said second MOS transistor being characterized by a breakdown voltage substantially lower than the certain breakdown voltage; and
a third MOS transistor of the P type having a drain coupled to the drain of the second MOS transistor, a source coupled to the third terminal, and a gate coupled to the second terminal, wherein the first positive potential has an absolute value greater than an absolute value of the second potential.

32. A potential detecting circuit comprising:
first means for receiving an input potential, the input potential having an absolute value equal to or lower than a first negative potential;
second means for receiving a second potential;
third means for receiving a reference voltage having an absolute value less than the absolute value of the second potential;
means for generating a dependent potential varying in accordance with the input terminal;
a first MOS transistor of a P type having a gate responsive to the dependent potential, and a drain coupled to the first means, and a source, the first MOS transistor being characterized by a certain breakdown voltage;
a second MOS transistor of an N type having a source coupled to the source of the first MOS transistor, a gate coupled to the second means, and a drain, said second MOS transistor being characterized by a breakdown voltage substantially lower than the certain breakdown voltage; and
a third MOS transistor of the P type having a drain coupled to the drain of the second MOS transistor, a source coupled to the third means, and a gate coupled to the second potential;

wherein the second potential is a negative potential, the first potential is another negative potential lower than the second potential, wherein the first negative potential has an absolute value greater than an absolute value of the second potential.

33. A potential detecting circuit comprising:
a first terminal for receiving an input potential, the input potential having an absolute value equal to or lower than a first potential;
a second terminal for receiving a second potential;
a third terminal for receiving a reference voltage having an absolute value less than the absolute value of the second potential;
means for generating a dependent potential varying in accordance with the input potential;
first MOS transistor of a first conductivity type and depletion type having gate responsive to the dependent potential, and a drain coupled to the first terminal, and a source, the first MOS transistor being characterized by a certain breakdown voltage;
a second MOS transistor of a second conductivity type having a source coupled to the source of the first MOS transistor, a gate coupled to the second terminal, and a drain, said second MOS transistor being characterized by a breakdown voltage substantially lower than the certain breakdown voltage; and
a third MOS transistor of the first conductivity type having a drain coupled to the drain of the second MOS transistor, a source coupled to the third terminal, and a gate coupled to the second terminal, wherein the first potential has an absolute valve greater than an absolute value of the second potential.

34. A potential detecting circuit comprising:
a first terminal for receiving an input potential, the input potential having an absolute value equal to or lower than a first potential;
a second terminal for receiving a second potential;
a third terminal for receiving a reference voltage having an absolute value less than an absolute value of the second potential;
means for generating a dependent potential varying in accordance with the input potential;
a first MOS transistor of a first conductivity type having a gate responsive to the dependent potential, and a drain coupled to the first terminal, and a source, the first MOS transistor being characterized by a certain breakdown voltage;
a second MOS transistor of a second conductivity type having a source coupled to the source of the first MOS transistor, a gate coupled to the second terminal, and a drain, the second MOS transistor being characterized by a breakdown voltage substantially lower than the certain breakdown voltage;
a third MOS transistor of the first conductivity type having a drain coupled to the drain of the second MOS transistor, a source coupled to the third terminal, and a gate coupled to the second terminal; and means, responsive to a potential on the drain of the second MOS transistor, for generating a signal having either the reference potential or the second potential, wherein the first potential has an absolute valve greater than an absolute value of the second potential.

35. A potential detecting circuit comprising:
first means for receiving an input potential, the input potential having an absolute value equal to or lower than a first potential;
second means for receiving a second potential;
third means for receiving a reference voltage having an absolute value less than an absolute value of the second potential;
fourth means for receiving another potential;
a first MOS transistor of a first conductivity type having a gate coupled to the fourth means, and a drain coupled to the first means, and a source, the first MOS transistor being characterized by a certain breakdown voltage;
a second MOS transistor of a second conductivity type having a source coupled to the source of the first MOS transistor, a gate coupled to the second means, and a drain, the second MOS transistor being characterized by a breakdown voltage substantially lower than the certain breakdown voltage;
a third MOS transistor of the first conductivity type having a drain coupled to the drain of the second MOS transistor, a source coupled to the third terminal means, and a gate coupled to the second potential; and
a level converting circuit, responsive to a voltage at the drain of the second MOS transistor, for generating a converted potential having a value of the reference potential or the second potential, including
a fourth MOS transistor of the first conductivity type, having a drain coupled to the drain of the second MOS transistor, a gate coupled to the second means, and a source; and
an inverter having an input coupled to the source of the fourth MOS transistor,
wherein the first potential has an absolute value greater than an absolute value of the second potential.

* * * * *